United States Patent
Chuang

(10) Patent No.: US 8,040,646 B2
(45) Date of Patent: Oct. 18, 2011

(54) INPUT/OUTPUT BUFFER AND ELECTROSTATIC DISCHARGE PROTECTION CIRCUIT

(75) Inventor: Chien-Hui Chuang, Taipei County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 118 days.

(21) Appl. No.: 12/431,779

(22) Filed: Apr. 29, 2009

(65) Prior Publication Data

US 2010/0277842 A1 Nov. 4, 2010

(51) Int. Cl.
*H02H 3/22* (2006.01)
(52) U.S. Cl. .......................... 361/56; 361/111
(58) Field of Classification Search .................. 361/56, 361/58, 91, 111
See application file for complete search history.

(56) References Cited

U.S. PATENT DOCUMENTS

| | | | | |
|---|---|---|---|---|
| 4,990,802 A | * | 2/1991 | Smooha | 326/15 |
| 5,051,860 A | * | 9/1991 | Lee et al. | 361/58 |
| 5,157,573 A | * | 10/1992 | Lee et al. | 361/56 |
| 6,583,972 B2 | | 6/2003 | Verhaege et al. | |
| 6,898,062 B2 | | 5/2005 | Russ et al. | |
| 7,005,708 B2 | | 2/2006 | Mergens et al. | |
| 7,692,905 B2 | * | 4/2010 | Hung | 361/56 |

* cited by examiner

*Primary Examiner* — Danny Nguyen
(74) *Attorney, Agent, or Firm* — Winston Hsu; Scott Margo

(57) ABSTRACT

A buffer device includes a first driving circuit coupled between a signal terminal of the buffer device and a first reference potential, a current-limiting component including a first terminal coupled to the signal terminal, and a second driving circuit coupled between a second terminal of the current-limiting component and a second reference potential, wherein the current-limiting component limits an amount of ESD current flowing through the second driving circuit, and makes an amount of ESD current flowing through the first driving circuit be larger than the amount of ESD current flowing through the second driving circuit.

28 Claims, 6 Drawing Sheets

INPUT/OUTPUT BUFFER AND ELECTROSTATIC DISCHARGE PROTECTION CIRCUIT

BACKGROUND

The present invention relates to a buffer circuit, and more particularly to a low cost buffer circuit having the capability of discharging static electricity.

In an integrated circuit (IC), an input/output (I/O) buffer is utilized for driving an output signal of the integrated circuit to other electronic devices, such as another integrated circuit, via an I/O pad of the I/O buffer. Normally, the driving capability of the I/O buffer is dependent on the size of the I/O buffer. For example, the width of the transistor forming the I/O buffer may need to be as large as a few hundred micrometers to provide enough driving capability for the output signal. In addition, since the I/O pad of the I/O buffer is exposed to the external environment when the I/O buffer is fabricated, the capability to discharge the static electricity is another concern of the I/O buffer. To meet the requirement of the ESD (Electrostatic Discharge) specification, the foundry that manufactures the integrated circuit further standardizes the ESD rules of the transistor forming the I/O buffer in order to sustain the high current produced by the static electricity. Normally, the ESD rules of the transistor can be significantly larger than the normal DRC (Design Rule Check) rules of the core transistor in the integrated circuit. Accordingly, the conventional I/O buffer occupies a large part of area in the integrated circuit and consequently increases the cost of the integrated circuit. Therefore, providing a small size I/O buffer for the integrated circuit while maintaining the capability to drive the output signal and discharge static electricity is a significant concern in the semiconductor industry.

SUMMARY OF THE INVENTION

One of the objectives of the present invention is to provide a low cost buffer circuit having the capability of discharging static electricity.

According to a first embodiment of the present invention, a buffer device is disclosed. The buffer device comprises a first driving circuit, a current-limiting component, and a second driving circuit. The first driving circuit is coupled between a signal terminal of the buffer device and a first reference potential. The current-limiting component comprises a first terminal coupled to the signal terminal. The second driving circuit is coupled between a second terminal of the current-limiting component and a second reference potential, wherein the current-limiting component limits an amount of ESD current flowing through the second driving circuit, and makes an amount of ESD current flowing through the first driving circuit be larger than the amount of ESD current flowing through the second driving circuit.

According to a second embodiment of the present invention, an electrostatic discharge (ESD) protection circuit is disclosed. The electrostatic discharge protection circuit comprises a buffer device and a clamping device. The buffer device comprises: a first driving circuit coupled between a signal pad and a first potential pad, a current-limiting component comprising a first terminal coupled to the signal pad, and a second driving circuit coupled between a second terminal of the current-limiting component and a second potential pad, wherein the first and second potential pads comprise a power pad and a ground pad. The clamping device is coupled between the first potential pad and the second potential pad. The current-limiting component limits an amount of ESD current flowing through the second driving circuit, and makes an amount of ESD current flowing through the first driving circuit be larger than the amount of ESD current flowing through the second driving circuit.

According to a third embodiment of the present invention, an electrostatic discharge protection circuit is disclosed. The electrostatic discharge protection circuit comprises a plurality of buffer devices. The plurality of buffer devices comprises a first buffer device and a second buffer device. The first buffer device comprises: a first driving circuit coupled between a first signal pad and a first reference potential, a first current-limiting component comprising a first terminal coupled to the first signal pad, and a second driving circuit coupled between a second terminal of the first current-limiting component and a second reference potential. The second buffer device comprises: a third driving circuit coupled between a second signal pad and the first reference potential, a second current-limiting component comprising a first terminal coupled to the second signal pad, and a fourth driving circuit coupled between a second terminal of the second current-limiting component and the second reference potential. The first current-limiting component limits an amount of ESD current flowing through the second driving circuit, and makes an amount of ESD current flowing through the first driving circuit be larger than the amount of ESD current flowing through the second driving circuit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
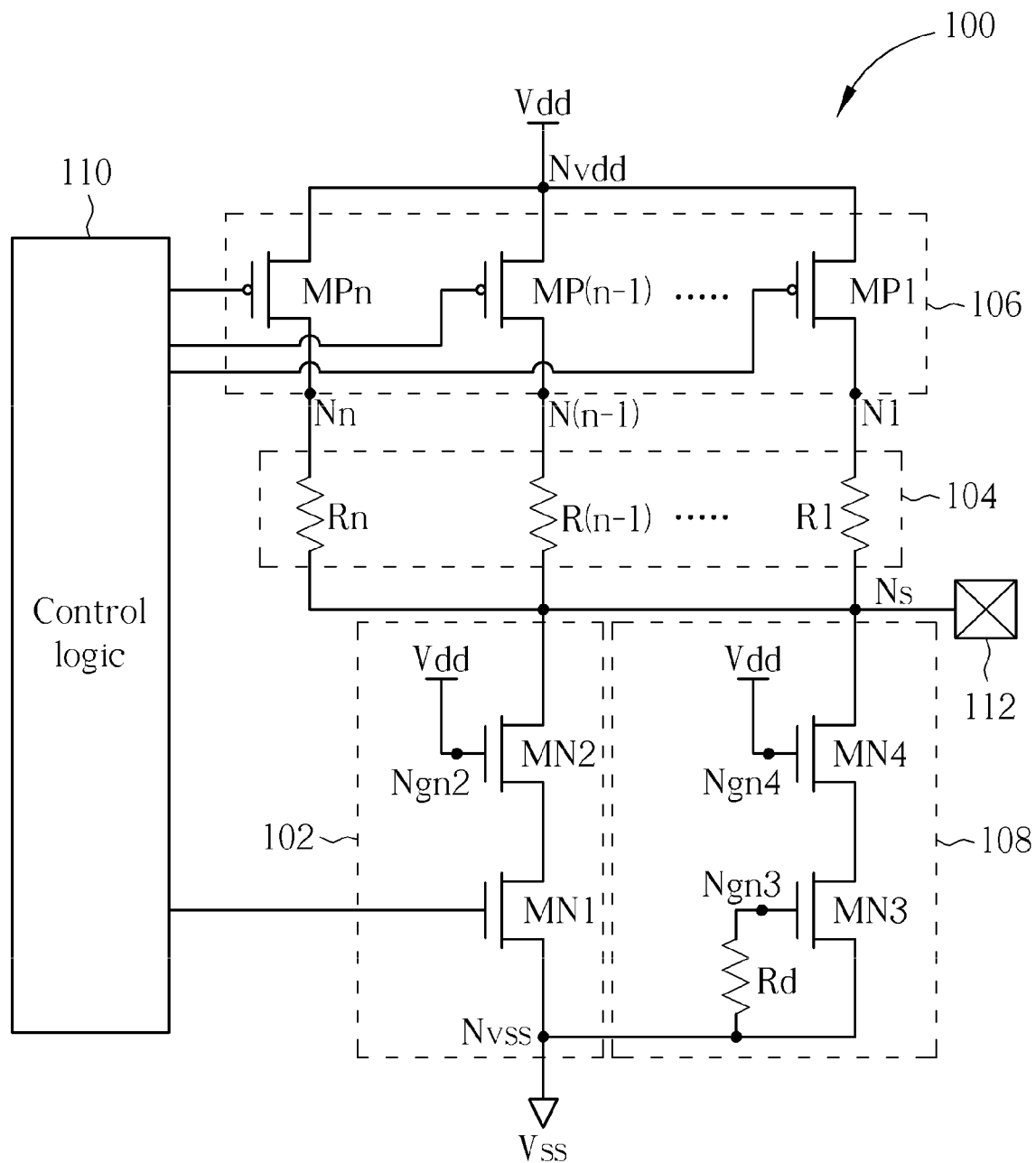
FIG. 1 is a diagram illustrating a buffer device according to a first embodiment of the present invention.

Please refer to FIG. 1. FIG. 1 is a diagram illustrating a buffer device 100 according to a first embodiment of the present invention. The buffer device 100 may include a first driving circuit 102, a current-limiting component 104, a second driving circuit 106, and an auxiliary circuit 108. For the purpose of description, a control logic 110 is further coupled to the first driving circuit 102 and the second driving circuit 106, and the control logic 110 is utilized for controlling the first driving circuit 102 and the second driving circuit 106 to generate an output signal. The first driving circuit 102 is coupled between a signal terminal Ns of the buffer device 100 and a first reference potential Vss. The current-limiting component 104 is coupled between the signal terminal Ns and the second driving circuit 106. The second driving circuit 106 is coupled between the current-limiting component 104 and a second reference potential Vdd.

In this embodiment, the second driving circuit 106 may include a plurality of PMOS (P-type metal oxide semiconductor) transistors MP1-MPn and the current-limiting component 104 may include a plurality of resistors R1-Rn, wherein the drain terminals of the transistors MP1-MPn are coupled to the resistors R1-Rn at terminal N1-Nn respectively, as shown in FIG. 1. The resistors R1-Rn may be, but not limited to, poly resistors, salicide blocking resistors, no-salicide diffusion resistors or a combination thereof. The value of the resistors R1-Rn may be, but not limited to, not smaller than zero and not larger than a value $R_{optimal}$, which can be adjusted according to the driving capability. $R_{optimal}$ may be smaller for larger driving capability. The value of the resistors R1-Rn may be or may not be the same as each other. Please note that the first driving circuit 102 may be a pull-low circuit and the second driving circuit 106 may be a pull-up circuit. In this embodiment, the pull-low circuit is implemented by a first NMOS (N-type metal oxide semiconductor) transistor MN1 and a second NMOS transistor MN2, wherein the first NMOS transistor MN1 is cascaded with the second NMOS transistor MN2. In addition, the second NMOS transistor MN2 may be an always on transistor since the gate terminal Ngn2 of the second NMOS transistor MN2 may be electrically connected to the second reference potential Vdd, and the first NMOS transistor MN1 and the transistors MP1-MPn could be controlled by the control logic 110 as the embodiment shown in FIG. 1. Since the first driving circuit 102 could be a cascaded circuit, the second reference potential Vdd can be set to a relatively high supply voltage, such as 5V.

In addition, the signal terminal Ns may be electrically connected to a signal pad 112, e.g., an input/output pad (I/O pad), and the buffer device 100 may further comprise an auxiliary circuit 108 of the first driving circuit 102, wherein the auxiliary circuit 108 may be coupled between the signal pad 112 (i.e., the signal terminal Ns) and the first reference potential Vss, and the auxiliary circuit 108 may be operative only when triggered by an electrostatic discharge (ESD) event. In this embodiment, the auxiliary circuit 108 comprises a third NMOS transistor MN3 and a fourth NMOS transistor MN4, wherein the third NMOS transistor MN3 is cascaded with the fourth NMOS transistor MN4. Similarly, the fourth NMOS transistor MN4 may be an always on transistor since the gate terminal Ngn4 of the fourth NMOS transistor MN4 may be electrically connected to the second reference potential Vdd, and the third NMOS transistor MN3 may be an always off transistor during normal operation of the buffer device 100, in which the gate terminal Ngn3 of the third NMOS transistor MN3 may be coupled to the first reference potential Vss via a resistor Rd as shown in FIG. 1.

According to the buffer device 100 as shown in the embodiment of FIG. 1, the current-limiting component 104 hinders the current from flowing to the terminal Nvdd, which couples to the second reference potential Vdd, from the signal pad 112 when the positive stress of the static electricity is induced at the signal pad 112, or the current-limiting component 104 hinders the current from flowing to the signal pad 112 from the terminal Nvdd when the negative stress of the static electricity is induced at the signal pad 112. The current-limiting component 104 may limit an amount of ESD current flowing through the second driving circuit 106 and make an amount of ESD current flowing through the first driving circuit 102 be larger than the amount of ESD current flowing through the second driving circuit 106. The amount of ESD current flowing through the second driving circuit 106 may even be zero. In other words, when the static electricity occurs at the signal pad 112, the first driving circuit 102 and the auxiliary circuit 108 would discharge the static electricity to the terminal Nvss, which couples to the first reference potential Vss, from the signal pad 112, or vice versa. Therefore, it may not be necessary for the layout of the PMOS transistors MP1-MPn to conform to an electrostatic discharge (ESD) rule since there may not be static electricity current passing through the PMOS transistors MP1-MPn. Accordingly, the size of the second driving circuit 106 can be reduced substantially as shown in FIG. 2.

Figure 2:
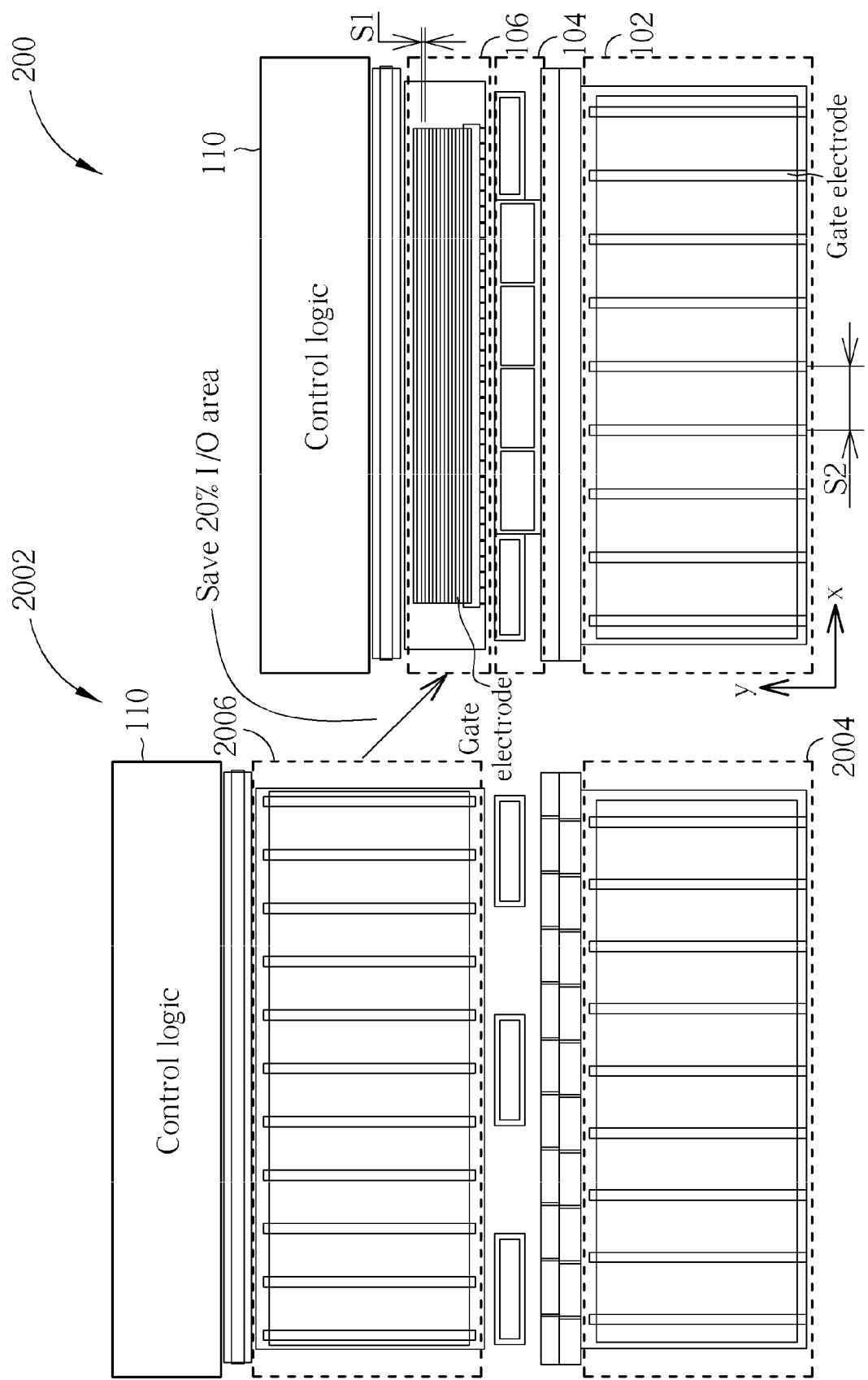
FIG. 2 is a diagram illustrating the buffer device shown in FIG. 1.

FIG. 2 is a diagram 200 illustrating the buffer device 100 as shown in FIG. 1. The diagram 200 comprises the control logic 110, the layouts of the second driving circuit 106, the current-limiting component 104, and the first driving circuit 102. Please note that, in order to describe features of the present invention more clearly, a diagram 2002 of a conventional buffer device without the current-limiting component 104 is also shown in FIG. 2. The floor plan 2002 comprises the control logic 110, the layouts of the conventional second driving circuit 2006, and the conventional first driving circuit 2004. As is shown, the area of the conventional second driving circuit 2006 that conforms to the electrostatic discharge rule is much larger than the area of the second driving circuit 106 that does not conform to the electrostatic discharge rule. Furthermore, even when the area of the current-limiting component 104 is included, the total area of the diagram 200 of the buffer device 100 is still smaller than the diagram 2002 of the conventional buffer device (e.g. reduced approximately 20%). More specifically, the present invention may re-arrange the layouts of the PMOS transistors MP1-MPn of the second driving circuit 106 to reduce the area of the second driving circuit 106. In other words, in this embodiment, but not limit, the orientation, which is parallel with Y-axis shown in FIG. 2, of the gate electrodes of the NMOS transistors MN1, MN2 of the first driving circuit 102 may be substantially orthogonal to orientation, which is parallel with X-axis, of the gate electrodes of the PMOS transistors MP1-MPn of the second driving circuit 106. Besides, a space S1 between the PMOS transistors MP1-MPn of the second driving circuit 106 may be smaller than a space S2 between the NMOS transistors MN1, MN2 of the first driving circuit 102. Accordingly, the cost of the proposed buffer device 100 is lower than the conventional buffer device.

Figure 3:
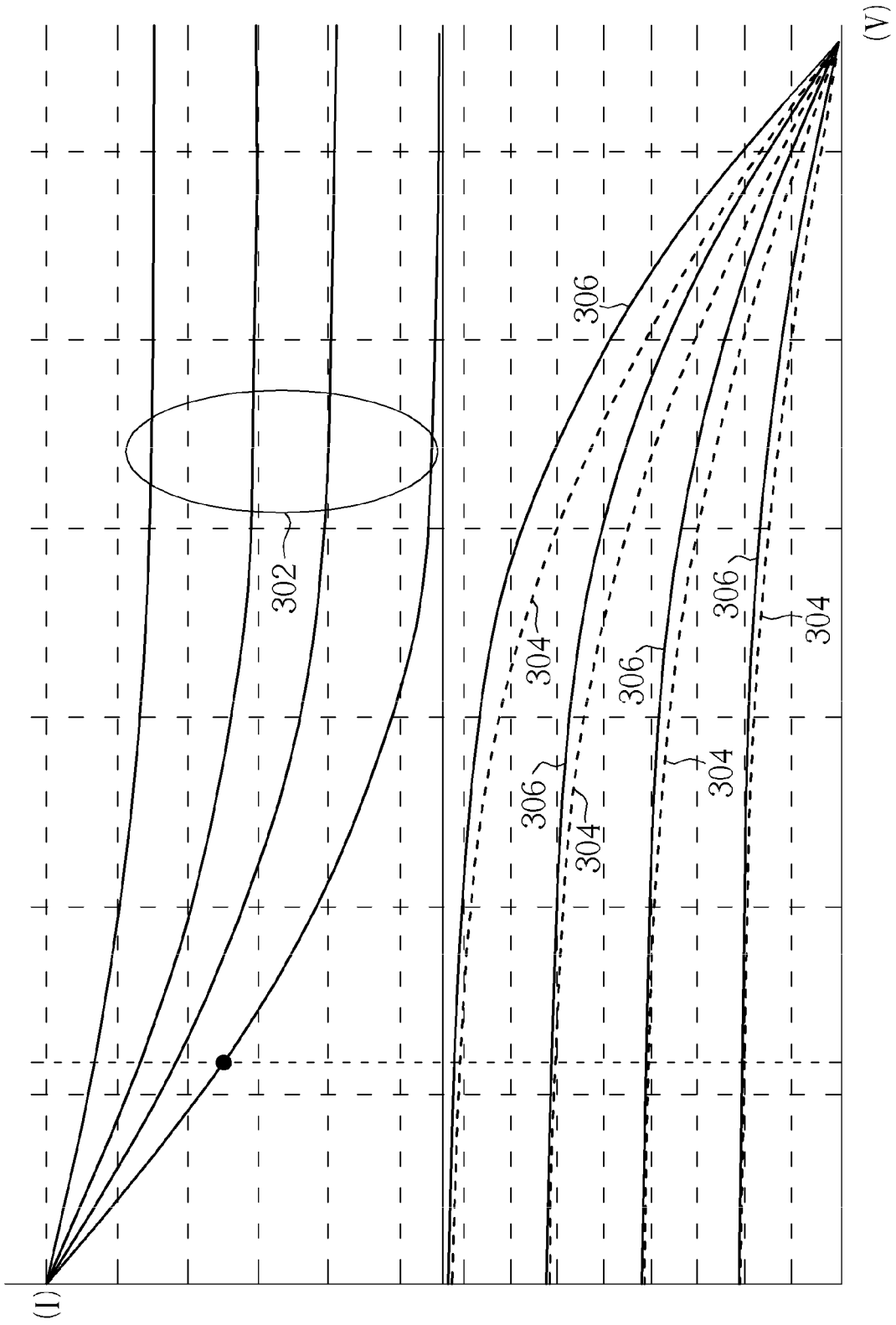
FIG. 3 is a diagram illustrating a DC characteristic of a conventional buffer device compared to the buffer device shown in FIG. 1.

FIG. 3 is a diagram illustrating the DC characteristic of the conventional buffer device and the buffer device 100 shown in FIG. 1. The curves 302 illustrate the DC characteristic of the conventional first driving circuit 2004 and the first driving circuit 102, the curves 304 illustrate the DC characteristic of the second driving circuit 106, and the curves 306 illustrate the DC characteristic of the conventional second driving circuit 2006. As shown, the DC characteristic of the conventional first driving circuit 2004 may overlap with the DC characteristic of the first driving circuit 102, and the DC characteristic of the second driving circuit 106 is only degraded a little from the DC characteristic of the conventional second driving circuit 2006 at ohmic operating region of transistor, which is acceptable for the I/O buffer.

Figure 4:
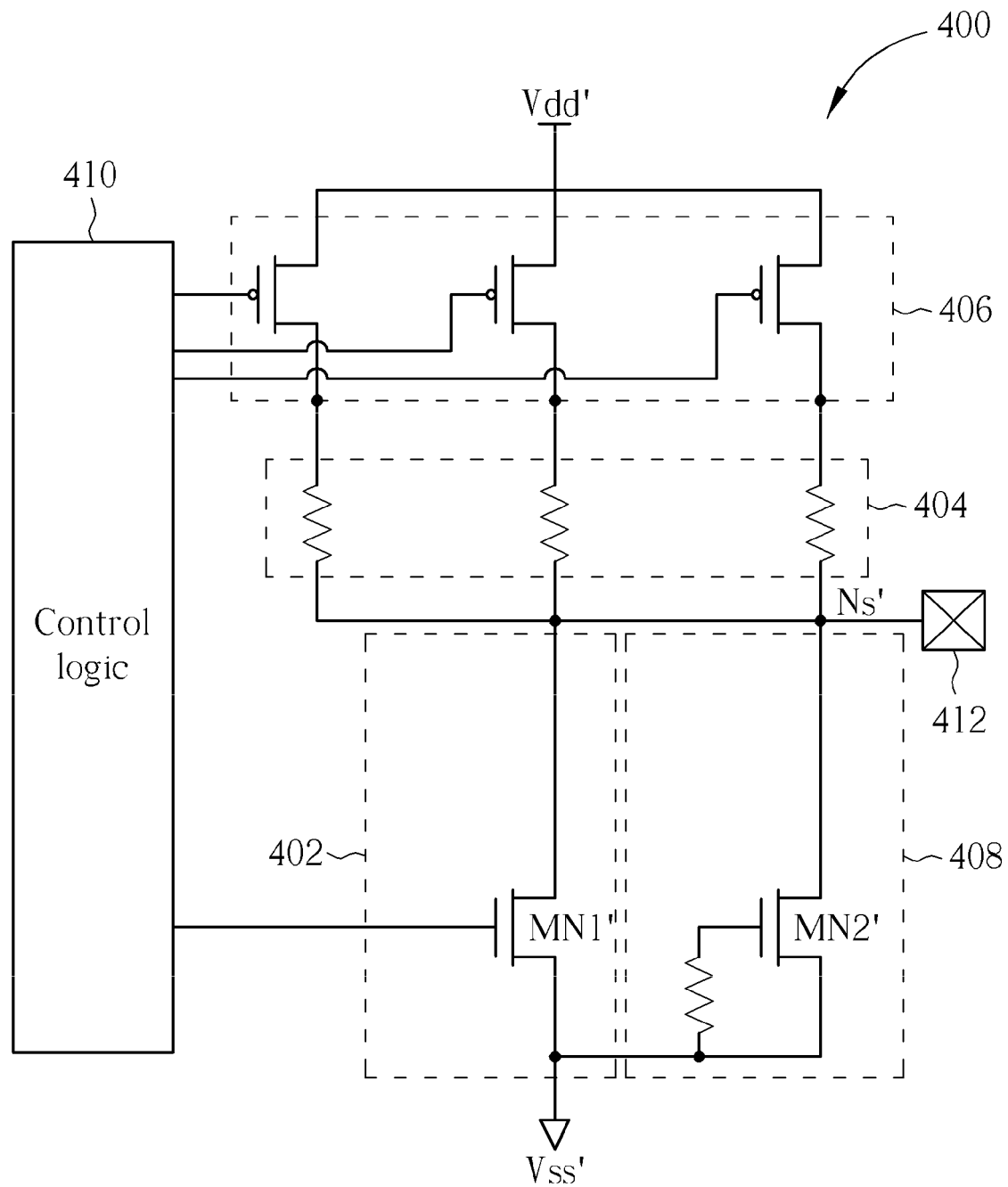
FIG. 4 is a diagram illustrating a buffer device according to a second embodiment of the present invention.

Please refer to FIG. 4. FIG. 4 is a diagram illustrating a buffer device 400 according to a second embodiment of the present invention. The buffer device 400 comprises a first driving circuit 402, a current-limiting component 404, a second driving circuit 406, and an auxiliary circuit 408. In addition, a control logic 410 may further be coupled to the first driving circuit 402 and the second driving circuit 406. The control logic 410 may be utilized for controlling the first driving circuit 402 and the second driving circuit 406 to generate an output signal to a signal pad 412. The first driving circuit 402 is coupled between a signal terminal Ns' of the buffer device 400 and a first reference potential Vss'. The current-limiting component 404 is coupled between the signal terminal Ns' and the second driving circuit 406. The second driving circuit 406 is coupled between the current-limiting component 404 and a second reference potential Vdd'.

Compared to the buffer device 100, the first driving circuit 402 and the auxiliary circuit 408 of the buffer device 400 each only comprise one NMOS transistor, which are NMOS transistor MN1' and MN2' respectively, rather than the cascaded transistors. Therefore, the second reference potential Vdd' can be set to a relatively low supply voltage, such as 3.3V. Please note that, a person of ordinary skill in the art should readily understand that the buffer device 400 also possesses the advantage of lowering cost and the DC characteristic of the buffer device 100, thus a detailed description of these benefits is omitted herein for brevity. The current-limiting component 404 may limit an amount of ESD current flowing through the second driving circuit 406 and make an amount of ESD current flowing through the first driving circuit 402 be larger than the amount of ESD current flowing through the second driving circuit 406. The amount of ESD current flowing through the second driving circuit 406 may even be zero. Since current-limiting component 404 may limit the amount of ESD current flowing through the second driving circuit 406, it may not be necessary for the layout of the second driving circuit 406 to conform to the ESD rule. Accordingly, the size of the second driving circuit 406 can be reduced substantially as shown in FIG. 2.

Figure 5:
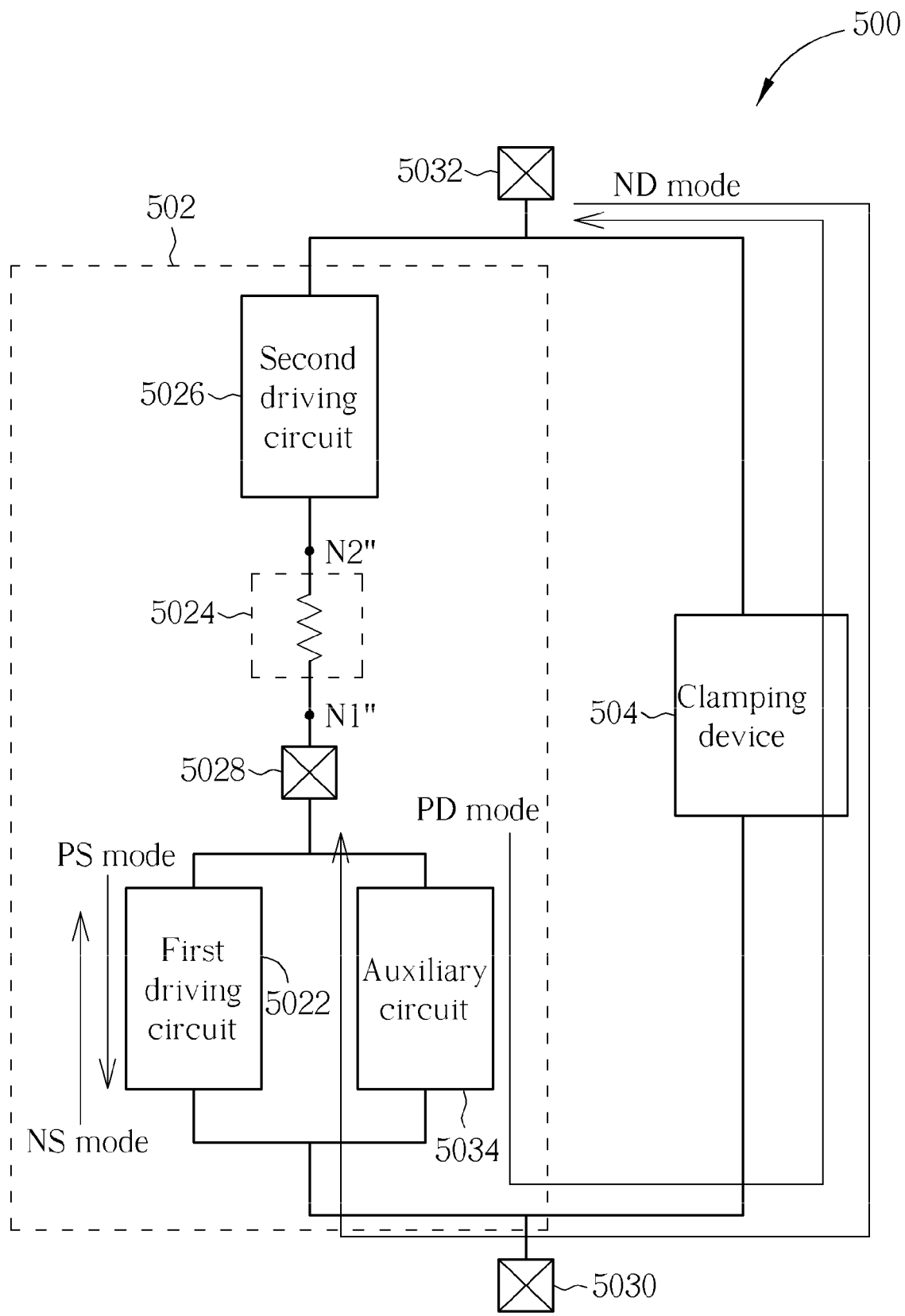
FIG. 5 is a diagram illustrating an electrostatic discharge protection circuit according to a third embodiment of the present invention.

Please refer to FIG. 5. FIG. 5 is a diagram illustrating an electrostatic discharge (ESD) protection circuit 500 according to a third embodiment of the present invention. The electrostatic discharge protection circuit 500 comprises a buffer device 502 and a clamping device 504. According to this embodiment, the buffer device 502 can be the exemplary buffer device 100 or the exemplary buffer device 400 of the present invention. Therefore, the buffer device 502 comprises a first driving circuit 5022, a current-limiting component 5024, and a second driving circuit 5026. The first driving circuit 5022 is coupled between a signal pad 5028 and a first potential pad 5030. The current-limiting component 5024 comprises a first terminal N1" coupled to the signal pad 5028. The second driving circuit 5026 is coupled between a second terminal N2" of the current-limiting component 5024 and a second potential pad 5032, wherein the first and second potential pads 5030, 5032 may comprise a power pad and a ground pad, respectively. The clamping device 504 may be coupled between the first potential pad 5030 and the second potential pad 5032. In addition, the buffer device 502 may further comprise an auxiliary circuit 5034 of the first driving circuit 5022 coupled between the signal pad 5028 and the first potential pad 5030, and the auxiliary circuit 5034 may be operative only when triggered by an ESD event. It should be noted that the PMOS transistor(s) of the second driving circuit 5026 may not conform to the ESD rule, while the NMOS transistor(s) of the first driving circuit 5022 and the auxiliary circuit 5034 may conform to the ESD rule.

When the electrostatic discharge protection circuit 500 is tested under the positive-to-VSS (PS) mode, the first driving circuit 5022 and the auxiliary circuit 5034 may discharge the static electricity from the signal pad 5028 to the first potential pad 5030, wherein the potential pad 5030 may be a ground pad. When the electrostatic discharge protection circuit 500 is tested under the negative-to-VSS (NS) mode, the first driving circuit 5022 and the auxiliary circuit 5034 may discharge the static electricity from the first potential pad 5030 to the signal pad 5028.

When the electrostatic discharge protection circuit 500 is tested under the positive-to-VDD (PD) mode, static electricity may be discharged from the signal pad 5028 to the second potential pad 5032 via the first driving circuit 5022, the auxiliary circuit 5034, and the clamping device 504 rather than the second driving circuit 5026, since the current-limiting component 5024 may hinder the current generated by the static electricity from flowing through the second driving circuit 5026. The current-limiting component 5024 may limit an amount of ESD current flowing through the second driving circuit 5026 and make an amount of ESD current flowing through the first driving circuit 5022 be larger than the amount of ESD current flowing through the second driving circuit 5026. The amount of ESD current flowing through the second driving circuit 5026 may even be zero. Since current-limiting component 5024 may limit the amount of ESD current flowing through the second driving circuit 5026, it may not be necessary for the layout of the second driving circuit 5026 to conform to the ESD rule. Accordingly, the size of the second driving circuit 5026 can be reduced substantially as shown in FIG. 2.

When the electrostatic discharge protection circuit 500 is tested under the negative-to-VDD (ND) mode, the static electricity is discharged from the second potential pad 5032 to the signal pad 5028 via the clamping device 504, the first driving circuit 5022, and the auxiliary circuit 5034 rather than the second driving circuit 5026, since the current-limiting component 5024 may hinder the current generated by the static electricity from flowing through the second driving circuit 5026.

It should be noted that, the NMOS transistors of the first driving circuit 5022 and the auxiliary circuit 5034 may be in breakdown under the positive-to-VSS mode. The parasitic diode of the first driving circuit 5022 and the auxiliary circuit 5034 may be forward biased under the negative-to-VSS mode. The NMOS transistors of the first driving circuit 5022 and the auxiliary circuit 5034 may be in breakdown and the parasitic diode of the clamping device 504 may be forward biased under positive-to-Vdd mode. The parasitic diode of the clamping device 504 may be in breakdown and the parasitic diodes of the first driving circuit 5022 and the auxiliary circuit 5034 may be forward biased under negative-to-Vdd mode.

Figure 6:
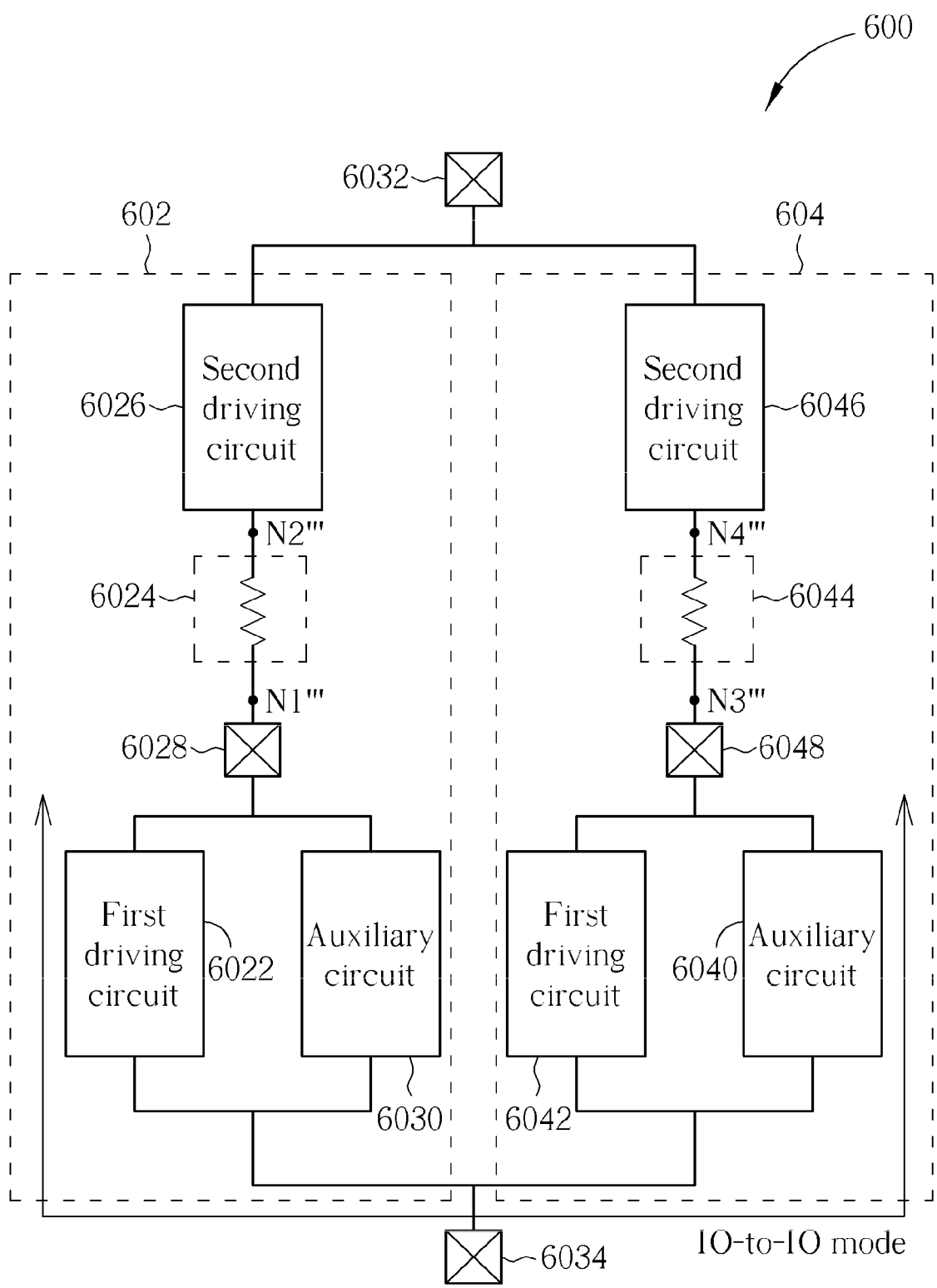
FIG. 6 is a diagram illustrating an electrostatic discharge protection circuit according to a fourth embodiment of the present invention.

Please refer to FIG. 6. FIG. 6 is a diagram illustrating an electrostatic discharge (ESD) protection circuit 600 according to a fourth embodiment of the present invention. The electrostatic discharge protection circuit 600 may comprise a first buffer device 602 and a second buffer device 604. According to this embodiment, one of the first buffer device 602 and the second buffer device 604 or both of the first buffer device 602 and the second buffer device 604 can be the buffer device 100 or the buffer device 400 of the present invention. In this embodiment, both of the first buffer device 602 and the second buffer device 604 can be the buffer device 100 or the buffer device 400. Therefore, the first buffer device 602 may comprise a first driving circuit 6022, a current-limiting component 6024, and a second driving circuit 6026. The first driving circuit 6022 is coupled between a signal pad 6028 and a first potential pad 6034. The current-limiting component 6024 comprises a first terminal N1''' coupled to the signal pad 6028. The second driving circuit 5026 is coupled between a second terminal N2''' of the current-limiting component 6024 and a second potential pad 6032, wherein the first and second potential pads 6034 and 6032 may comprise a ground pad and a power pad, respectively. The first buffer device 602 may further comprise an auxiliary circuit 6030 of the first driving circuit 6022 coupled between the signal pad 6028 and the first potential pad 6034, and the auxiliary circuit 6030 may be operative only when triggered by an ESD event. Similarly, the second buffer device 604 may comprise a first driving circuit 6042, a current-limiting component 6044, and a second driving circuit 6046. The first driving circuit 6042 is coupled between a signal pad 6048 and the first potential pad 6034. The current-limiting component 6044 comprises a first terminal N3''' coupled to the signal pad 6048. The second driving circuit 6046 is coupled between a second terminal N4''' of the current-limiting component 6044 and the second potential pad 6032. The second buffer device 604 may further comprise a auxiliary circuit 6040 of the first driving circuit 6042 coupled between the signal pad 6048 and the first potential pad 6034, and the auxiliary circuit 6040 may be operative only when triggered by the ESD event. The current-limiting components 6024 and 6044 may limit amounts of ESD current flowing through the second driving circuits 6026 and 6046, and make amounts of ESD current flowing through the first driving circuit 6022 and 6042 be larger than the amounts of ESD current flowing through the second driving circuit 6026 and 6046. The amounts of ESD current flowing through the second driving circuit 6026 and 6046 may even be zero. Since current-limiting components 6024 and 6044 may limit the amount of ESD currents flowing through the second driving circuits 6026 and 6046, it may not be necessary for the layouts of the second driving circuits 6026 and 6046 to conform to the ESD rule. Accordingly, the size of the second driving circuits 6026 and 6046 can be reduced substantially as shown in FIG. 2.

It should be noted that the PMOS transistors of the second driving circuits 6026, 6046 may not conform to the ESD rule, while the NMOS transistors of the first driving circuits 6022, 6042 and the auxiliary circuit 6030, 6040 may conform to the ESD rule.

When the electrostatic discharge protection circuit 600 is tested under the IO-to-IO mode, the first driving circuits 6022, 6042, and the auxiliary circuits 6030, 6040 may discharge the static electricity from the signal pad 6028 to the signal pad 6048, and vice versa.

To test the exemplary electrostatic discharge protection circuit 500 according to the present invention, the electrostatic discharge protection circuit 500 may be fabricated by two different foundries, and two versions of electrostatic discharge protection circuit 500 may be fabricated, one version may be operated under 3.3V (e.g., Vdd'=3.3V), and the other version may be operated under 5V (e.g., Vdd=5V). In addition, each version maybe tested by two modes, which are human body mode (HBM) and machine mode (MM). The tolerant voltage of the ESD path between the I/O pad and the ground pad (i.e., IO-to-VSS) under the human body mode, the tolerant voltage of the ESD path between the I/O pad and the power pad (i.e., IO-to-VDD) under the human body mode, the tolerant voltage of the ESD path between the I/O pad and the ground pad (i.e., IO-to-VSS) under the machine mode, and the tolerant voltage of the ESD path between the I/O pad and the power pad (i.e., IO-to-VDD) under the machine mode may be determined. It could be found that the present invention may greatly reduce the size of the I/O buffer in comparison with the conventional I/O buffer while maintaining the driving capability (i.e., DC characteristic) and the ESD capability.

Those skilled in the art will readily observe that numerous modifications and alterations of the device and method may be made while retaining the teachings of the invention.

What is claimed is:

1. A buffer device, comprising:
   a first driving circuit, coupled between a signal terminal of the buffer device and a first reference potential;
   a current-limiting component, comprising a first terminal coupled to the signal terminal; and
   a second driving circuit, coupled between a second terminal of the current-limiting component and a second reference potential;
   wherein the current-limiting component limits an amount of ESD (Electro Static Discharge) current flowing through the second driving circuit, and makes an amount of ESD current flowing through the first driving circuit be larger than the amount of ESD current flowing through the second driving circuit and the current-limiting component.

2. The buffer device of claim 1, wherein the current-limiting component comprises a resistor.

3. The buffer device of claim 1, wherein the signal terminal is electrically connected to a signal pad, and the second driving circuit comprises a field effect transistor which does not conform to an electrostatic discharge (ESD) rule.

4. The buffer device of claim 1, wherein the signal terminal is electrically connected to a signal pad, and the buffer device further comprises an auxiliary circuit of the first driving circuit, wherein the auxiliary circuit is coupled between the signal pad and the first reference potential, and the auxiliary circuit is operative only when triggered by an electrostatic discharge (ESD) event.

5. The buffer device of claim 1, wherein:
   the first driving circuit comprises a plurality of field effect transistors; and
   the second driving circuit comprises a plurality of field effect transistors;
   wherein each of the plurality of field effect transistors of the first driving circuit and the plurality of field effect transistors of the second driving circuit has a gate electrode, orientation of the gate electrodes of the field effect transistors of the first driving circuit is substantially orthogonal to orientation of the gate electrodes of the field effect transistors of the second driving circuit.

6. The buffer device of claim 1, wherein:
   the first driving circuit comprises a plurality of field effect transistors; and
   the second driving circuit comprises a plurality of field effect transistors;
   wherein a space between the plurality of field effect transistors of the second driving circuit is smaller than a space between the plurality of field effect transistors of the first driving circuit.

7. An electrostatic discharge (ESD) protection circuit, comprising:
   a buffer device, comprising:
      a first driving circuit, coupled between a signal pad and a first potential pad;
      a current-limiting component, comprising a first terminal coupled to the signal pad; and a second driving circuit, coupled between a second terminal of the current-limiting component and a second potential pad, wherein the first and second potential pads comprise a power pad and a ground pad; and a clamping device, coupled between the first potential pad and the second potential pad;

wherein the current-limiting component limits an amount of ESD current flowing through the second driving circuit, and makes an amount of ESD current flowing through the first driving circuit be larger than the amount of ESD current flowing through the second driving circuit and the current-limiting component.

8. The ESD protection circuit of claim 7, wherein the first driving circuit discharges static electricity from the signal pad to the first potential pad under a first ESD mode; the first driving circuit discharges static electricity from the first potential pad to the signal pad under a second ESD mode; the first driving circuit and the clamping device discharge static electricity from the signal pad to the second potential pad under a third ESD mode; and the first driving circuit and the clamping device discharge static electricity from the second potential pad to the signal pad under a fourth ESD mode.

9. The ESD protection circuit of claim 8, wherein the first potential pad is the ground pad, the second potential pad is the power pad, the first ESD mode is a positive-to-VSS (PS) mode, the second ESD mode is a negative-to-VSS (NS) mode, the third ESD mode is a positive-to-VDD (PD) mode, and the fourth ESD mode is a negative-to-VDD (ND) mode.

10. The ESD protection circuit of claim 7, wherein the current-limiting component comprises a resistor.

11. The ESD protection circuit of claim 7, wherein the second driving circuit comprises a field effect transistor which does not conform to an ESD rule.

12. The ESD protection circuit of claim 7, wherein the buffer device further comprises:

an auxiliary circuit of the first driving circuit;

wherein the auxiliary circuit is coupled between the signal pad and the first potential pad, and the auxiliary circuit is operative only when triggered by an ESD event.

13. The ESD protection circuit of claim 7, wherein:

the first driving circuit comprises a plurality of field effect transistors; and the second driving circuit comprises a plurality of field effect transistors;

wherein each of the plurality of field effect transistors of the first driving circuit and the plurality of field effect transistors of the second driving circuit has a gate electrode, orientation of the gate electrodes of the field effect transistors of the first driving circuit is substantially orthogonal to orientation of the gate electrodes of the field effect transistors of the second driving circuit.

14. The ESD protection circuit of claim 7, wherein:

the first driving circuit comprises a plurality of field effect transistors; and the second driving circuit comprises a plurality of field effect transistors;

wherein a space between the plurality of field effect transistors of the second driving circuit is smaller than a space between the plurality of field effect transistors of the first driving circuit.

15. An electrostatic discharge (ESD) protection circuit, comprising:

a plurality of buffer devices connected in parallel, comprising:

a first buffer device, comprising:

a first driving circuit, coupled between a first signal pad and a first reference potential;

a first current-limiting component, comprising a first terminal coupled to the first signal pad; and a second driving circuit, coupled between a second terminal of the first current-limiting component and a second reference potential; and a second buffer device, comprising:

a third driving circuit, coupled between a second signal pad and the first reference potential;

a second current-limiting component, comprising a first terminal coupled to the second signal pad; and a fourth driving circuit, coupled between a second terminal of the second current-limiting component and the second reference potential;

wherein the first current-limiting component limits an amount of ESD current flowing through the second driving circuit, and makes an amount of ESD current flowing through the first driving circuit be larger than the amount of ESD current flowing through the second driving circuit.

16. The ESD protection circuit of claim 15, wherein the first driving circuit and the third driving circuit discharge static electricity from the first signal pad to the second signal pad under an ESD mode.

17. The ESD protection circuit of claim 16, wherein the ESD mode is an IO-to-IO mode.

18. The ESD protection circuit of claim 15, wherein at least one of the first and second current-limiting components comprises a resistor.

19. The ESD protection circuit of claim 15, wherein at least one of the second and fourth driving circuits comprises a field effect transistor which does not conform to an ESD rule.

20. The ESD protection circuit of claim 15, wherein the first buffer device further comprises:

an auxiliary circuit of the first driving circuit;

wherein the auxiliary circuit is coupled between the first signal pad and the first reference potential, and the auxiliary circuit is operative only when triggered by an ESD event.

21. The ESD protection circuit of claim 15, wherein the second buffer device further comprises:

an auxiliary circuit of the third driving circuit;

wherein the auxiliary circuit is coupled between the second signal pad and the first reference potential, and the auxiliary circuit is operative only when triggered by an ESD event.

22. The ESD protection circuit of claim 15, wherein:

the first driving circuit comprises a plurality of field effect transistors; and the second driving circuit comprises a plurality of field effect transistors;

wherein each of the plurality of field effect transistors of the first driving circuit and the plurality of field effect transistors of the second driving circuit has a gate electrode, orientation of the gate electrodes of the field effect transistors of the first driving circuit is substantially orthogonal to orientation of the gate electrodes of the field effect transistors of the second driving circuit.

23. The ESD protection circuit of claim 15, wherein:

the first driving circuit comprises a plurality of field effect transistors; and the second driving circuit comprises a plurality of field effect transistors;

wherein a space between the plurality of field effect transistors of the second driving circuit is smaller than a space between the plurality of field effect transistors of the first driving circuit.

24. A buffer device, comprising:
a first driving circuit, coupled between a signal terminal of the buffer device and a first reference potential;
a current-limiting component, comprising a first terminal coupled to the signal terminal; and
a second driving circuit, coupled between a second terminal of the current-limiting component and a second reference potential;
wherein the current-limiting component limits an amount of ESD (Electro Static Discharge) current flowing through the second driving circuit, and makes an amount of ESD current flowing through the first driving circuit be larger than the amount of ESD current flowing through the second driving circuit; the first driving circuit comprises a plurality of field effect transistors; the second driving circuit comprises a plurality of field effect transistors; and each of the plurality of field effect transistors of the first driving circuit and the plurality of field effect transistors of the second driving circuit has a gate electrode, orientation of the gate electrodes of the field effect transistors of the first driving circuit is substantially orthogonal to orientation of the gate electrodes of the field effect transistors of the second driving circuit.

25. A buffer device, comprising:
a first driving circuit, coupled between a signal terminal of the buffer device and a first reference potential;
a current-limiting component, comprising a first terminal coupled to the signal terminal; and
a second driving circuit, coupled between a second terminal of the current-limiting component and a second reference potential;
wherein the current-limiting component limits an amount of ESD (Electro Static Discharge) current flowing through the second driving circuit, and makes an amount of ESD current flowing through the first driving circuit be larger than the amount of ESD current flowing through the second driving circuit; the first driving circuit comprises a plurality of field effect transistors; the second driving circuit comprises a plurality of field effect transistors; and a space between the plurality of field effect transistors of the second driving circuit is smaller than a space between the plurality of field effect transistors of the first driving circuit.

26. An electrostatic discharge (ESD) protection circuit, comprising:
a buffer device, comprising:
a first driving circuit, coupled between a signal pad and a first potential pad;
a current-limiting component, comprising a first terminal coupled to the signal pad; and
a second driving circuit, coupled between a second terminal of the current-limiting component and a second potential pad, wherein the first and second potential pads comprise a power pad and a ground pad; and
a clamping device, coupled between the first potential pad and the second potential pad;
wherein the current-limiting component limits an amount of ESD current flowing through the second driving circuit, and makes an amount of ESD current flowing through the first driving circuit be larger than the amount of ESD current flowing through the second driving circuit; the first driving circuit discharges static electricity from the signal pad to the first potential pad under a first ESD mode; the first driving circuit discharges static electricity from the first potential pad to the signal pad under a second ESD mode; the first driving circuit and the clamping device discharge static electricity from the signal pad to the second potential pad under a third ESD mode; and the first driving circuit and the clamping device discharge static electricity from the second potential pad to the signal pad under a fourth ESD mode.

27. An electrostatic discharge (ESD) protection circuit, comprising:
a buffer device, comprising:
a first driving circuit, coupled between a signal pad and a first potential pad;
a current-limiting component, comprising a first terminal coupled to the signal pad; and
a second driving circuit, coupled between a second terminal of the current-limiting component and a second potential pad, wherein the first and second potential pads comprise a power pad and a ground pad; and
a clamping device, coupled between the first potential pad and the second potential pad;
wherein the current-limiting component limits an amount of ESD current flowing through the second driving circuit, and makes an amount of ESD current flowing through the first driving circuit be larger than the amount of ESD current flowing through the second driving circuit; the first driving circuit comprises a plurality of field effect transistors; the second driving circuit comprises a plurality of field effect transistors; and each of the plurality of field effect transistors of the first driving circuit and the plurality of field effect transistors of the second driving circuit has a gate electrode, orientation of the gate electrodes of the field effect transistors of the first driving circuit is substantially orthogonal to orientation of the gate electrodes of the field effect transistors of the second driving circuit.

28. An electrostatic discharge (ESD) protection circuit, comprising:
a buffer device, comprising:
a first driving circuit, coupled between a signal pad and a first potential pad;
a current-limiting component, comprising a first terminal coupled to the signal pad; and
a second driving circuit, coupled between a second terminal of the current-limiting component and a second potential pad, wherein the first and second potential pads comprise a power pad and a ground pad; and
a clamping device, coupled between the first potential pad and the second potential pad;
wherein the current-limiting component limits an amount of ESD current flowing through the second driving circuit, and makes an amount of ESD current flowing through the first driving circuit be larger than the amount of ESD current flowing through the second driving circuit; the first driving circuit comprises a plurality of field effect transistors; the second driving circuit comprises a plurality of field effect transistors; and a space between the plurality of field effect transistors of the second driving circuit is smaller than a space between the plurality of field effect transistors of the first driving circuit.

* * * * *